United States Patent
Suemasa et al.

(10) Patent No.: US 6,670,276 B1
(45) Date of Patent: Dec. 30, 2003

(54) PLASMA PROCESSING METHOD (75) Inventors: Tomoki Suemasa, Yamanashi (JP); Vaidyanathan Balasubramaniam, Beverly, MA (US); Koichiro Inazawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/691,202

(22) Filed: Oct. 19, 2000

(30) Foreign Application Priority Data

Oct. 19, 1999 (JP) .......................................... 11-296693

(51) Int. Cl.$^7$ ............................................. H01L 21/20
(52) U.S. Cl. ....................... 438/706; 436/706; 436/710; 436/711; 436/712; 436/719; 438/710; 438/712; 438/719
(58) Field of Search ................................ 438/706, 710, 438/711, 712, 719

(56) References Cited

U.S. PATENT DOCUMENTS

| | | | |
|---|---|---|---|
| 4,349,609 A | * | 9/1982 | Takeda et al. ............... 428/429 |
| 5,698,339 A | * | 12/1997 | Kawakami et al. .......... 429/212 |
| 5,783,363 A | * | 7/1998 | Thomas ....................... 430/296 |
| 5,877,080 A | * | 3/1999 | Aoi et al. .................... 438/622 |
| 6,204,168 B1 | * | 3/2001 | Naik et al. ................... 438/638 |
| 6,207,493 B1 | * | 3/2001 | Furukawa et al. .......... 438/246 |
| 6,221,772 B1 | * | 4/2001 | Yang et al. .................. 438/689 |
| 6,475,922 B1 | * | 11/2002 | Zheng ......................... 438/725 |

* cited by examiner

*Primary Examiner*—Robert Kunemund
(74) *Attorney, Agent, or Firm*—Finnegan, Henderson, Farabow, Garrett & Dunner, LLP (57) ABSTRACT

A wafer W is placed on a lower electrode 106 provided inside a processing chamber 102 of a plasma processing apparatus 100. A film constituted an organic polysiloxane, which is a Low-K material is formed at the wafer W. Plasma is generated inside the processing chamber 102 to implement an etching process by using a photoresist film on the organic polysiloxane film as a mask and an opening pattern in which a portion of the organic polysiloxane film is exposed is formed. After the etching process, the wafer W is left inside the processing chamber 102. The pressure inside the processing chamber 102 is set at a level within the range of 30 mTorr (4.00 Pa)~150 mTorr (20.0 Pa) by inducing a processing gas into the processing chamber 102 and evacuating the gas from the processing chamber 102. At the pressure level the set, the gas inside the processing chamber 102 is raised to plasma and the photoresist film is ashed. Thus, a plasma processing method which makes it possible to remove the photoresist film on the organic polysiloxane film without compromising the low dielectric constant characteristics of the organic polysiloxane film is achieved.

3 Claims, 6 Drawing Sheets

(1) Before Etching
(2) After Etching
(3) Ashing by This Invention Method
(4) Ashing by Method in the Prior Art

PLASMA PROCESSING METHOD

BACKGROUND OF THE INVENTION

1. Field of the Invention

The present invention relates to a plasma processing method.

2. Description of the Related Art

During the process of manufacturing a semiconductor device, a technology whereby an opening pattern is formed, for instance, at a layer insulating film of a workpiece by implementing a plasma etching process on the workpiece is adopted in the prior art. In this process, a photoresist film formed on the layer insulating film is used as a mask. Under normal circumstances, the photoresist film must be removed after the etching process. Accordingly, the processed workpiece is delivered into the processing chamber of an ashing apparatus from the etching apparatus. After the workpiece is brought in, the pressure of the atmosphere inside the processing chamber is sustained at a level equal to or higher than 300 mTorr (40.0 Pa) through induction of a processing gas and vacuum drawing. In addition, the workpiece is heated to a temperature equal to or higher than 150° C. When the various conditions have been established, the processing gas inside the processing chamber is raised to plasma to ash the photoresist film.

A technology for achieving faster semiconductor device operation by utilizing a film constituted of a material achieving a low dielectric constant (hereafter referred to as a "Low-K") instead of the $SiO_2$ film used in the prior art as the layer insulating film has been proposed in recent years. However, a process performed under high-pressure conditions such as the ashing process in the prior art described above causes a change in the properties of the Low-K film, and its dielectric constant becomes higher. This poses a problem in that a faster semiconductor device operation cannot be achieved even when a Low-K film is used to constitute the layer insulating film.

In addition, a Low-K film normally absorbs moisture readily. When the Low-K film is patterned through an etching process, a portion of the Low-K film becomes exposed. This results in a problem that when the workpiece is exposed to the atmosphere while it is delivered from the etching apparatus to the ashing apparatus as described above, the Low-K film absorbs the moisture in the atmosphere and the dielectric constant of the Low-K film rises.

SUMMARY OF THE INVENTION

An object of the present invention, which has been completed by addressing the problems of the prior art discussed above, is to provide a new and improved plasma processing method that eliminates the problems above and other problems as well.

In order to achieve the object described above, the present invention provides a plasma processing method comprising a step in which a plasma etching process is implemented on a workpiece placed inside a processing chamber by using a photoresist film on an organic polysiloxane film formed at the workpiece to form a pattern in which a portion of the organic polysiloxane film is exposed and then the photoresist film is removed, a step in which a processing gas is induced into the processing chamber and the pressure inside the processing chamber is set within a range of 30 mTorr (4.00 Pa)~150 mTorr (20.0 Pa) and a step in which the processing gas is raised to plasma at the pressure thus set to remove the photoresist film from the workpiece on which the pattern has been formed, as disclosed in claim 1.

The workpiece to undergo the process according to the present invention has already undergone an etching process with at least the opening portion of the pattern formed at the organic polysiloxane film exposed. Organic polysiloxane constituting the film achieves the structure expressed in the following chemical formula, having an organic functional group containing a C atom and an H atom and O atoms bonded with an Si atom. (Chemical formula 1)

It is to be noted that the organic functional group represented as R in the chemical formula above may be any of alkyl groups such as a methyl group, an ethyl group and a propyl group and their derivatives or any of the alkyl groups such as phenyl radicals and derivatives. The C atom constituting the organic functional group is separated from the Si atom when the photoresist film on the organic polysiloxane film is removed at high pressure as in the method in the prior art. This results in a change in the molecular structure of the organic polysiloxane and the low dielectric constant characteristics unique to the organic polysiloxane film are lost. For this reason, according to the present invention, an ashing process is implemented under a pressure level set within the range of 30 mTorr (4.00 Pa)~150 mTorr (20.0 Pa) in which the C atom is not separated from the Si atom. Thus, the molecular structure of the organic polysiloxane is maintained even after the ashing process, thereby assuring the low dielectric constant characteristics of the organic polysiloxane film. As a result, by using the organic polysiloxane film to constitute a layer insulating film, for instance, a fast semiconductor device operation is achieved.

In addition, it is desirable to set the pressure inside the processing chamber within the range of 50 mTorr (6.66 Pa)~100 mTorr (13.3 Pa) as disclosed in claim 2, for instance. By implementing the ashing process at such a pressure, changes in the film properties of the organic polysiloxane film can be inhibited even more effectively.

It is also desirable to perform the step for removing the photoresist film in the same processing chamber where the plasma etching process has been performed, as disclosed in claims 3 and 4, for instance. Since this eliminates the need for the workpiece to be carried out of the processing chamber during the period of time elapsing between the end of the etching process and the start of the ashing process, the workpiece is never exposed to the atmosphere. As a result, the exposed organic polysiloxane film does not absorb any moisture from the atmosphere, thereby preventing the dielectric constant of the organic polysiloxane film from the increasing.

BRIEF DESCRIPTION OF THE DRAWINGS

Further objects and advantages of the invention can be more fully understood from the following detailed description taken in conjunction with the accompanying drawings, in which.

DETAILED DESCRIPTION OF THE PREFERRED EMBODIMENT

The following is a detailed explanation of a preferred embodiment in which the plasma processing method according to the present invention is adopted in a plasma ashing method, given in reference to the attached drawings.

(1) Structure of Plasma Processing Apparatus

Figure 1:
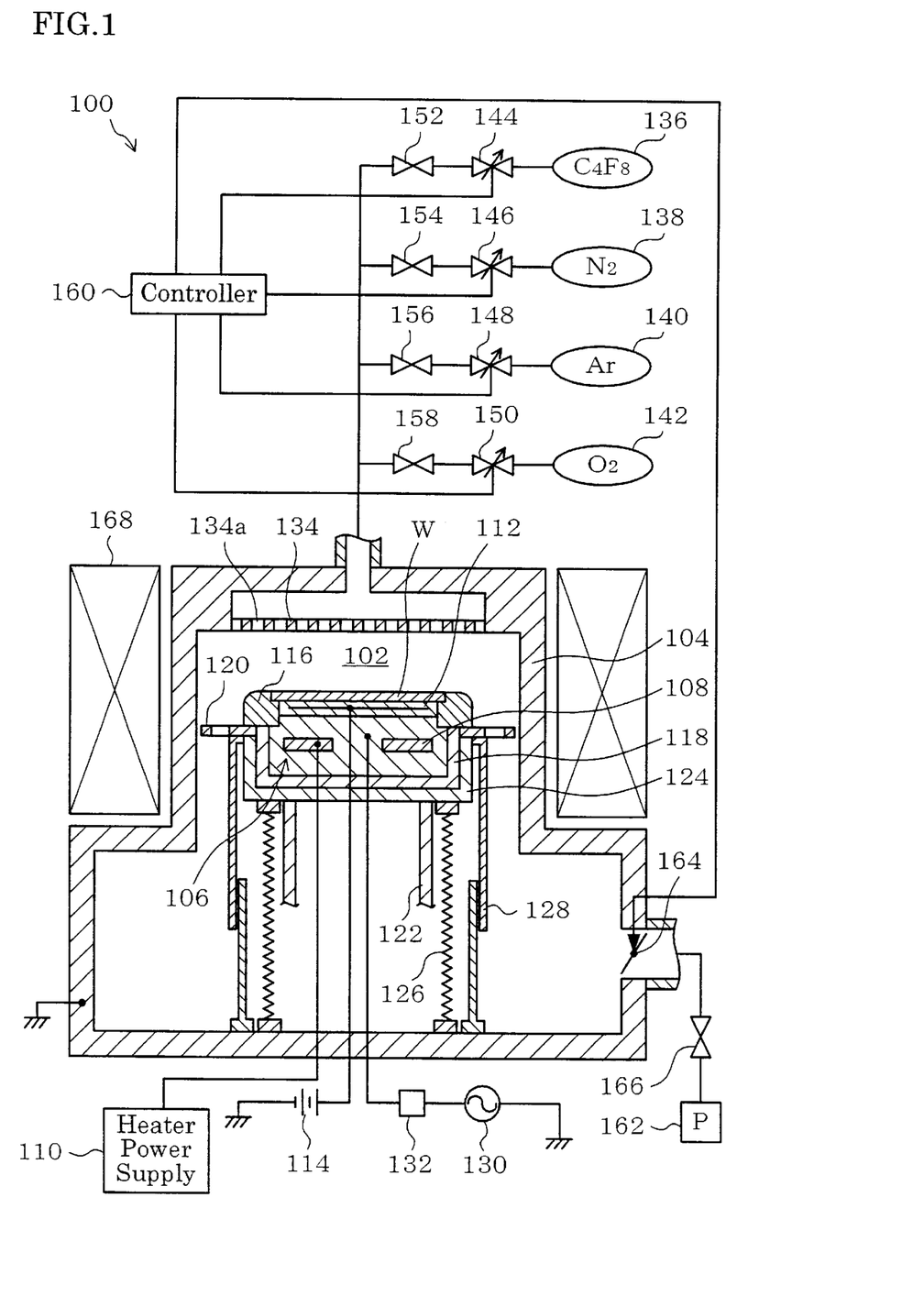
FIG. 1 is a schematic sectional view of a plasma processing apparatus that may adopt the present invention.

First, in reference to FIG. 1, the structure of a plasma processing apparatus 100 that may adopt the present invention is summarized. It is to be noted that the plasma processing apparatus 100 is capable of implementing both an etching process and an ashing process, as explained later. A processing chamber 102 of the plasma processing apparatus 100 is formed inside an airtight and electrically conductive processing container 104. A conductive lower electrode 106 is provided inside the processing chamber 102. The lower electrode 106 also functions as a stage on which a workpiece such as a semiconductor wafer (hereafter or referred to as a "wafer") W is placed. In addition, a means for temperature adjustment, e.g., a heater 108, is internally provided at the lower electrode 106 so that the temperature of the wafer W can be adjusted. A heater power supply 110 is connected to the heater 108. The heater power supply 110 adjusts the level of power applied to the heater 108 as necessary to maintain the temperature of the wafer W heated by the heater 108 at a specific level.

In addition, an electrostatic chuck 112 is provided at the mounting surface of the lower electrode 106. With a high level DC voltage applied from a high-voltage DC source 114, the electrostatic chuck 112 holds the wafer W mounted on the chuck surface. An insulating ring body 116 is provided at the lower electrode 106 so as to surround the wafer W mounted on the electrostatic chuck 112. A baffle plate 120 is provided around the lower electrode 106 via an insulating member 118.

An elevator shaft 122 is connected to the lower electrode 106 via a conductive member 124 and the insulating member 118. The lower electrode 106 is moved up and down in accordance with a drive mechanism (not shown) connected to the elevator shaft 122. Furthermore, a bellows 126 constituted of an electrically conductive and airtight expandable material and a conductive bellows cover 128 are provided at the periphery of the elevator shaft 122. The bellows 126 and the bellows cover 128 are each connected to the conductive member 124 and the bottom of the processing container 104 at the two ends. In addition, a high-frequency source 130 that outputs high-frequency power is connected to the lower electrode 106 via a matcher 132.

An upper electrode 134 is provided facing opposite the mounting surface of the lower electrode 106 inside the processing chamber 102. The upper electrode 134 is grounded via the processing container 104. Numerous gas outlet holes 134a are formed at the upper electrode 134. Thus, various processing gases inside first~fourth gas supply sources 136, 138, 140 and 142 are supplied as necessary into the processing chamber 102 via first~fourth gas flow-regulating valves 144, 146, 148 and 150, and first~fourth switching valves 152, 154, 156 and 158 and the gas outlet holes 134a. A controller 160 is connected to the first~fourth gas flow-regulating valves 144, 146, 148 and 150. The controller 160 controls the first fourth gas flow regulating valves 144, 146, 148 and 150 to adjust the flow rates of the various processing gases induced into the processing chamber 102.

In addition, the gas inside the processing chamber 102 is evacuated by a vacuum pump P162 via an air volume displacement adjusting valve 164 and a switching valve 168. The controller 160 mentioned above is connected to the air volume displacement adjusting valve 164. The controller 160 adjusts the air volume displacement by the gas evacuated from the processing chamber 102 as necessary by controlling the air volume displacement adjusting valve 164. The pressure inside the processing chamber 102 in the processing apparatus structured as described above is sustained at a specific level by the controller 160 implementing control on the first~fourth gas flow-regulating valves 144, 146, 148 and 150 and the air volume displacement adjusting valve 164.

(2) Etching Process

Next, the etching process which is implemented by employing the plasma processing apparatus 100 described above prior to the ashing process according to the present invention is explained. First, the wafer W is placed on the lower electrode 106. An organic polysiloxane film (not shown) constituting a layer insulating film is formed at the wafer W. Organic polysiloxane constituting the film, which is a Low-K material, has a structure achieved by bonding O atoms and a methyl group ($CH_3$) to an Si atom as expressed in the chemical formula below. (chemical formula 2)

In addition, a photoresist film (not shown) constituting a mask is formed on the organic polysiloxane film. Heat is applied by the heater 110 to the wafer W on the lower electrode 106 via the lower electrode 106 so that its temperature is sustained at a specific level, e.g., lower than 150° C. and, more preferably, at 100° C.

Individual etching gases, e.g., $C_4F_8$, $N_2$ and Ar are induced into the processing chamber 102 from the first third gas supply sources 136, 138 and 140. In addition, the gas inside the processing chamber 102 is evacuated by the vacuum pump P162. During this process, the controller 160 implements control on the first third gas flow-regulating valves 144, 146 and 148 and the air volume displacement adjusting valve 164. Through this control, the pressure inside the processing chamber 102 is sustained at a specific constant level, e.g., within the range of 30 mTorr (4.00

Pa)~150 mTorr (20.0 Pa), more preferably within the range of 50 mTorr (6.66 Pa)~100 mTorr (13.3 Pa) and even more preferably at 45 mTorr (6.00Pa).

When the various conditions described above have been established, high-frequency power with a specific frequency, e.g. 13.56 MHz, output from the high-frequency source 130 is applied to the lower electrode 106. Through this power application, the etching gas is raised to plasma and thus the wafer W is etched. As a result, a specific opening pattern is formed at the organic polysiloxane film at the wafer W. After the pattern is formed at the organic polysiloxane film, the application of the high-frequency power to the lower electrode 106 is stopped to end the etching process.

(3) Ashing Process

Next, the ashing process is explained. This embodiment is characterized in that the ashing process is implemented on the wafer having undergone the process described above inside the same processing chamber 102 where the etching process has been performed while sustaining the same internal pressure at the processing chamber 102 and the same temperature for the wafer W as those during the etching process. In other words, the wafer W is not carried out of the processing chamber 102 when the etching process ends and remains on the lower electrode 106, with the temperature of the wafer W sustained at a level roughly equal to that during the etching process, i.e., under 150° C. and preferably at 100° C.

The controller 160 implements control on the first~third gas flow-regulating valves 144, 146 and 148 to stop the supply of the mixed gas containing $C_4F_8$, $N_2$ and Ar into the processing chamber 102. At the same time, the controller 160 implements control on the fourth gas flow-regulating valve 150 and induces an ashing gas, e.g., $O_2$, from the fourth gas supply source 142 into the processing chamber 102. Moreover, the controller 160 implements control on the fourth gas flow-regulating valve 150 and the air volume displacement adjusting valve 164 to sustain the pressure inside the processing chamber at a level roughly equal to that during the etching process i.e., within the range of 30 mTorr (4.00 Pa)~150 mTorr (20.0 Pa), preferably within the range of 50 mTorr (6.66 Pa)~100 mTorr (13.3 Pa) and even more preferably at 45 mTorr (6.00 Pa).

When the various conditions described above have been established, high-frequency power with a specific frequency, e.g., 13.56 MHz, output from the high-frequency source 130 is applied to the lower electrode 106. Through this power application, the ashing gas is raised to plasma and thus, the photoresist film at the wafer W is removed.

In this embodiment, the pressure inside the processing chamber 102 is set lower than the pressure setting in the prior art during the ashing process. The temperature of the wafer W, too, is set lower than the temperature setting in the prior art. By performing the ashing process under these conditions, the separation of the methyl group constituting the terminus of the organic polysiloxane molecule from the Si atom can be inhibited. As a result, the degree to which the film properties of the organic polysiloxane film change can be minimized, thereby preventing an increase in the dielectric constant.

In addition, according to the present invention, the etching process and the ashing process are performed in the same processing chamber 102. Thus, the wafer W is not taken out of the processing chamber 102 and is not exposed to the atmosphere until the ashing process is completed. As a result, the organic polysiloxane film does not absorb the moisture in the atmosphere, thereby preventing the methyl group from becoming replaced by a hydroxyl group (OH group) or the like. This makes it possible to prevent the increase in the dielectric constant of the organic polysiloxane film even more (4) Implementation Examples Examples of implementation of the present invention are explained. First, in reference to FIG. 2, the relationship between the pressure inside the processing chamber 102 during the processes and the degree of damage occurring to the organic polysiloxane film formed at the wafer W is explained. In these implementation examples, the wafer W was processed through the method and under the conditions described above, while the pressure inside the processing chamber 102 was varied.

Figure 2:
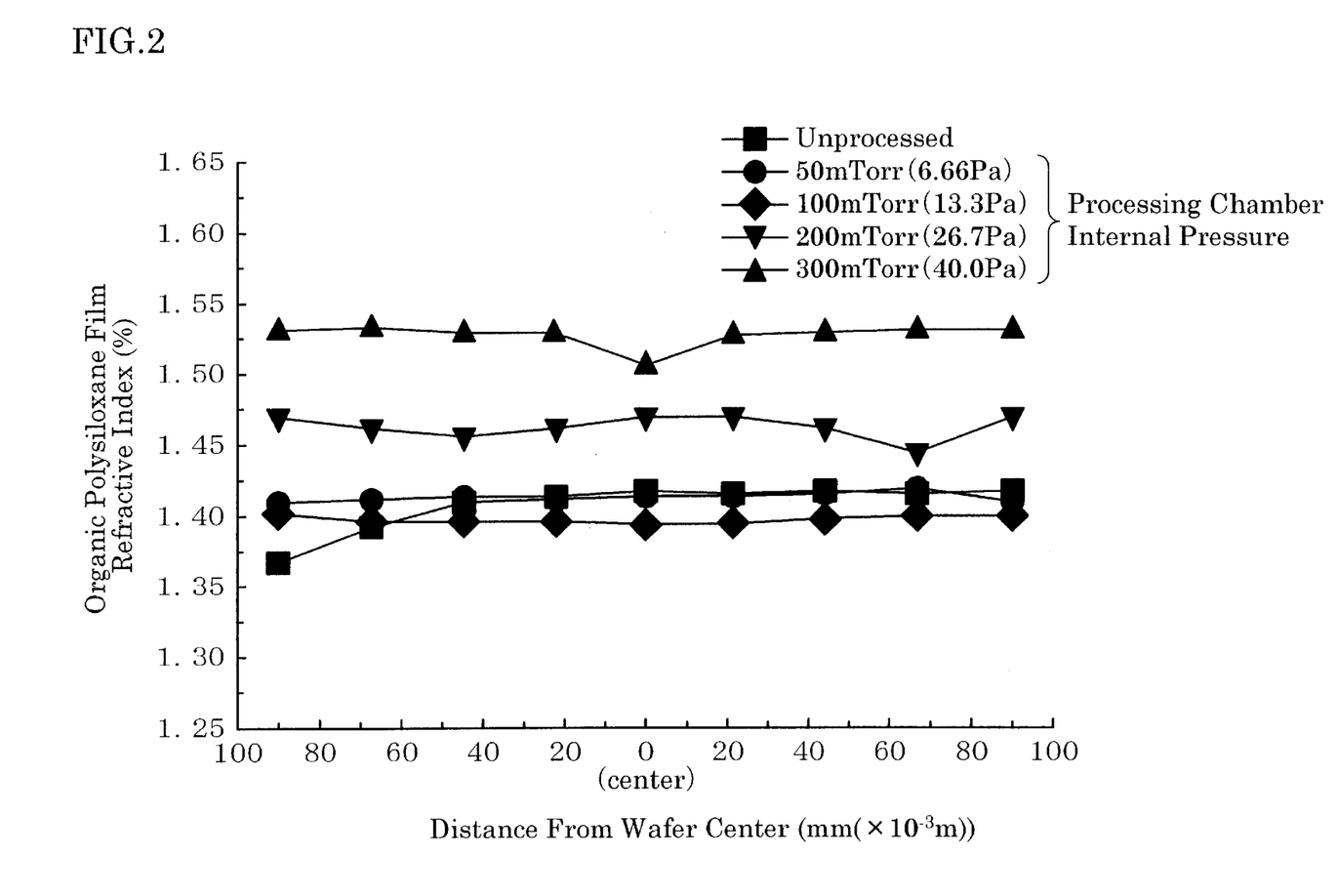
FIG. 2 schematically illustrates the relationship between the refractive index of the organic polysiloxane film and the distance from the center of the wafer achieved in examples of implementation of the present invention.

The results presented in FIG. 2 were obtained in the implementation examples. It is to be noted that FIG. 2 shows the relationship between the distance from the center of the wafer W and the refractive index of the organic polysiloxane film at the wafer W, ascertained for an unprocessed wafer W and each of the wafers W having undergone the etching process and the ashing process at varying pressure levels within the range of 50 mTorr (6.66 Pa)~300 mTorr (40.0 Pa). In addition, the closer the refractive index of the organic polysiloxane film to that of the unprocessed organic polysiloxane film, the smaller the degree to which the film properties changed.

As shown in FIG. 2, the refractive indices of the organic polysiloxane films having undergone processes at 50 mTorr (6.66 Pa) and 100 mTorr (13.3 Pa) were roughly equal to the refractive index of the unprocessed organic polysiloxane film over the entire surfaces of the wafers W. These results indicate that it is desirable to implement the ashing process at a pressure within a specific range that contains 50 mTorr (6.66 Pa)~100 mTorr (13.3 Pa). By implementing the process within such a pressure range, the photoresist film can be removed while minimizing the extent of damage to the organic polysiloxane film. In addition, the damage to the organic polysiloxane film was extensive at 200 mTorr (26.7 Pa). Thus, it is assumed that the upper limit for the pressure level in the above range is higher than 100 mTorr (13.3 Pa) but lower than 200 mTorr (26 Pa), e.g., 150 mTorr (20.0 Pa).

Figure 3:
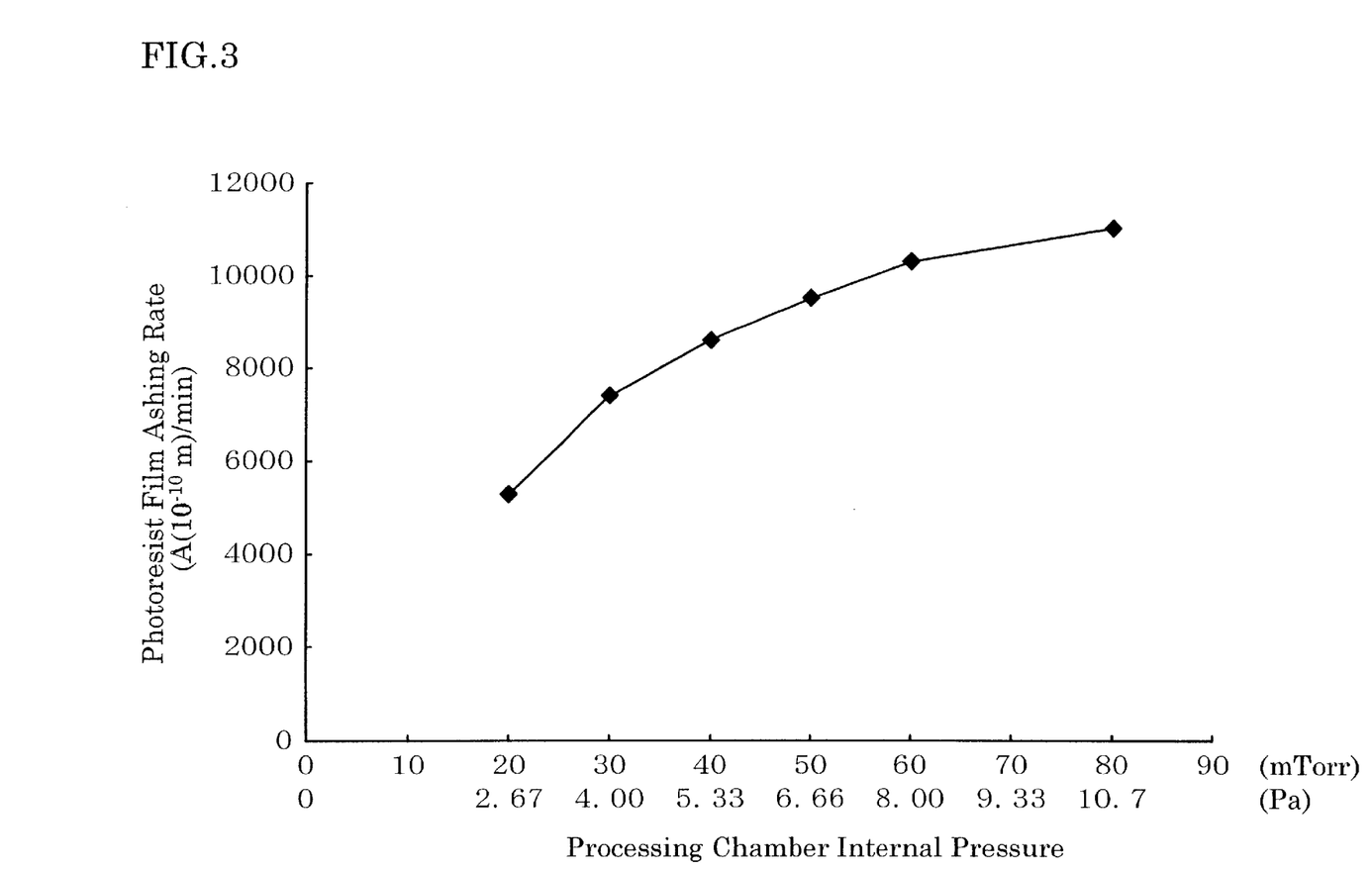
FIG. 3 schematically illustrates the relationship between the photoresist film ashing rate and the pressure inside the processing chamber achieved in examples of implementation of the present invention.

Next, in reference to FIG. 3, the relationship between the pressure inside the processing chamber 102 during the process and the ashing rate of the photoresist film is explained. In the implementation examples presented in FIG. 3, too, the process was implemented through the method and under the conditions described above, while varying the pressure inside the processing chamber 102. The results achieved in the implementation examples are presented in FIG. 3. It is to be noted that FIG. 3 shows the relationship between the internal pressure at the processing chamber 102 and the ashing rate of the photoresist film.

As shown in FIG. 3, when the process was implemented with the internal pressure at the processing chamber 102 at various levels equal to or above 30 mTorr (4.00 Pa) ashing rates exceeding 7000 ∈$(7.0×10^{-7}m)$ which is considered to be the minimum acceptable ashing rate under normal circumstances were achieved. These results indicate that it is desirable to implement the ashing process at a pressure level equal to or exceeding 30 mTorr (4.00 Pa). In addition, the results presented in FIGS. 2 and 3 indicate that it is desirable to implement the ashing process at a pressure level within the range of 30 mTorr (4.00 Pa)~150 mTorr (20.0 Pa) and, more desirably, within the range of 50 mTorr (6.66 Pa)~100 mTorr (13.3 Pa).

Figure 4:
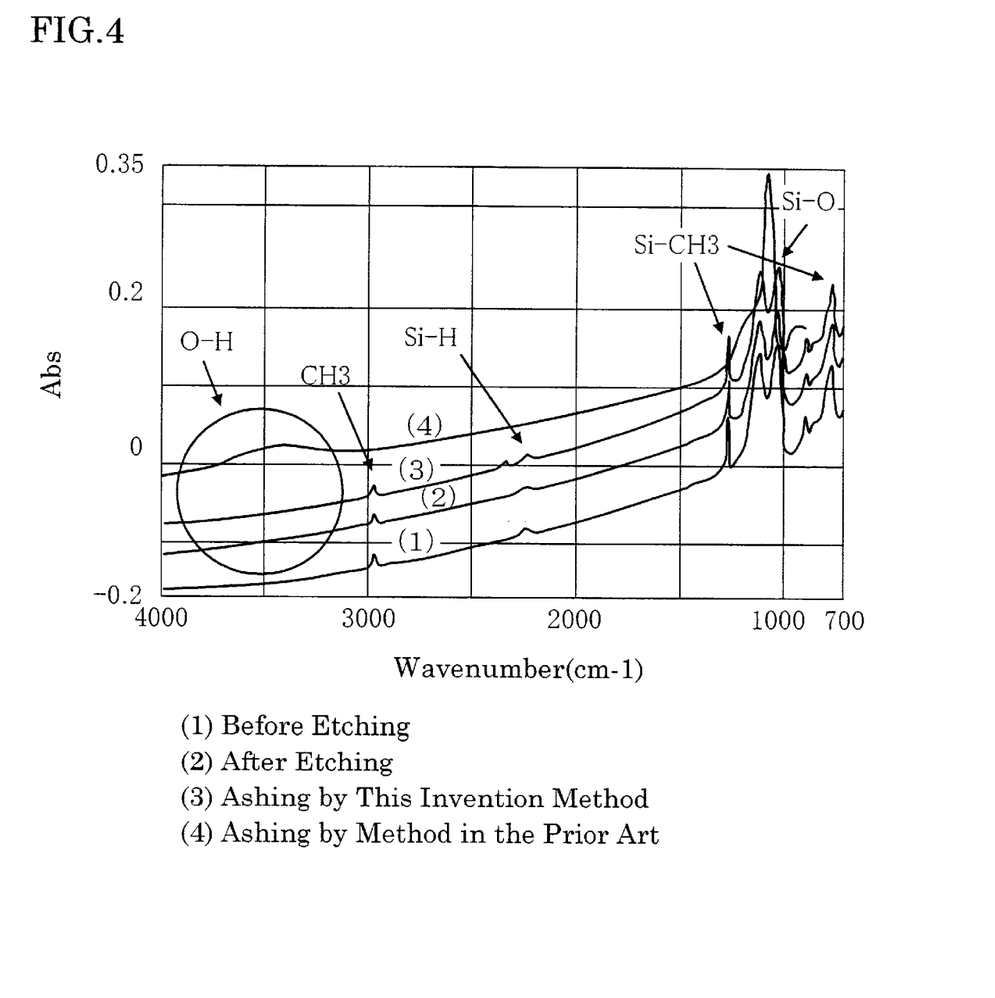
FIG. 4 shows changes occurring in the molecular structure of the organic polysiloxane film formed on silicon during various plasma processings.

FIG. 4 shows changes occurring in the molecular structure during various plasma processes performed on organic polysiloxane films formed on silicon. The individual curves in FIG. 4 each indicate the various bonds present in the organic polysiloxane film (1) before the etching process, (2) after the etching process performed by using $C_4F_8$ gas, (3) after an $O_2$ ashing process implemented at 50 mTorr within the etching chamber or (4) after an $O_2$ ashing process implemented at approximately 1 Torr in a conventional down-flow ashing apparatus following the etching process, ascertained through Fourier transformation infrared spectrophotometry (FTIR).

As the curve (4) in FIG. 4 indicates, a peak indicating the presence of an O—H bond manifests but a peak indicating the presence of another bond dissipates when the organic polysiloxane film underwent the $O_2$ ashing process at a high pressure in a conventional apparatus following the etching process. This indicates that the bond between the H atom and another atom was replaced by an O—H bond through moisture absorption.

It may be assumed that the organic polysiloxane film represented by the curve (3), which underwent the $O_2$ ashing process at the pressure level according to the present invention, did not absorb any moisture.

FIG. 5 shows compositional changes occurring in organic polysiloxane film during various plasma processes, ascertained through secondary ion mass spectrometry (SIMS). The presence of the Si, O and C atoms are indicated as the depths from the organic polysiloxane surface along the horizontal axis (a) shows the state before the etching process, (b) shows the state after the etching process, (c) shows the state of the organic polysiloxane film having undergone an $O_2$ ashing process in the method in the prior art and (d) shows the state of the organic polysiloxane film having undergone the $O_2$ ashing process according to the present invention.

Figure 5A:
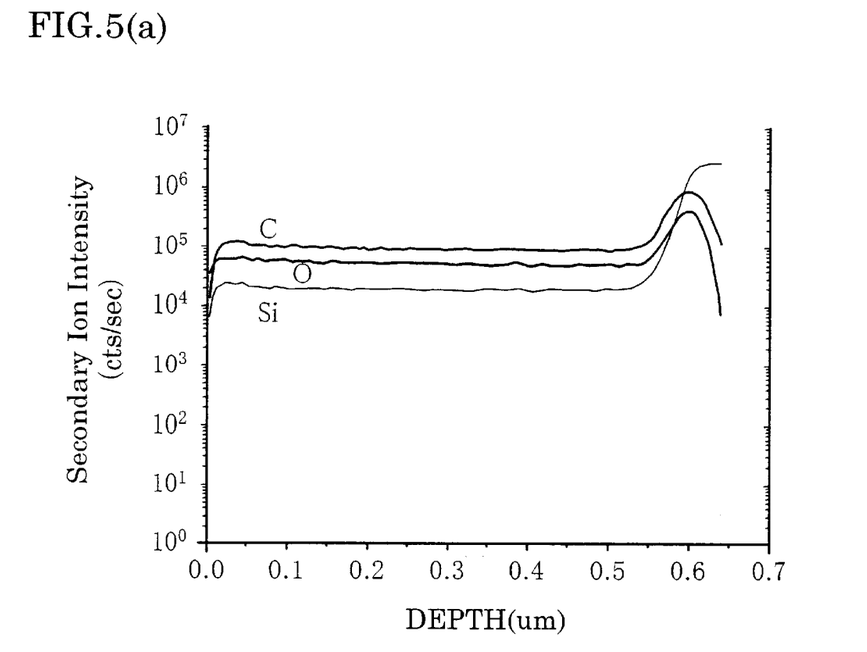
FIGS. 5(a) and (b) shows compositional changes occurring in the organic polysiloxane film during various plasma processes, measured through secondary ion mass spectrometry (SIMS).
Figure 5B:
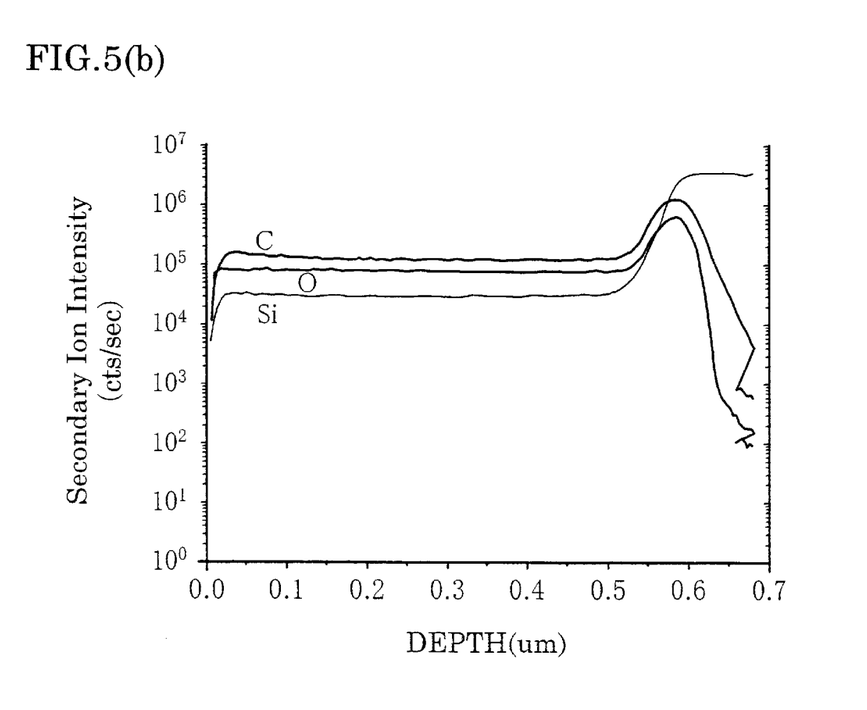
Figure 5C:
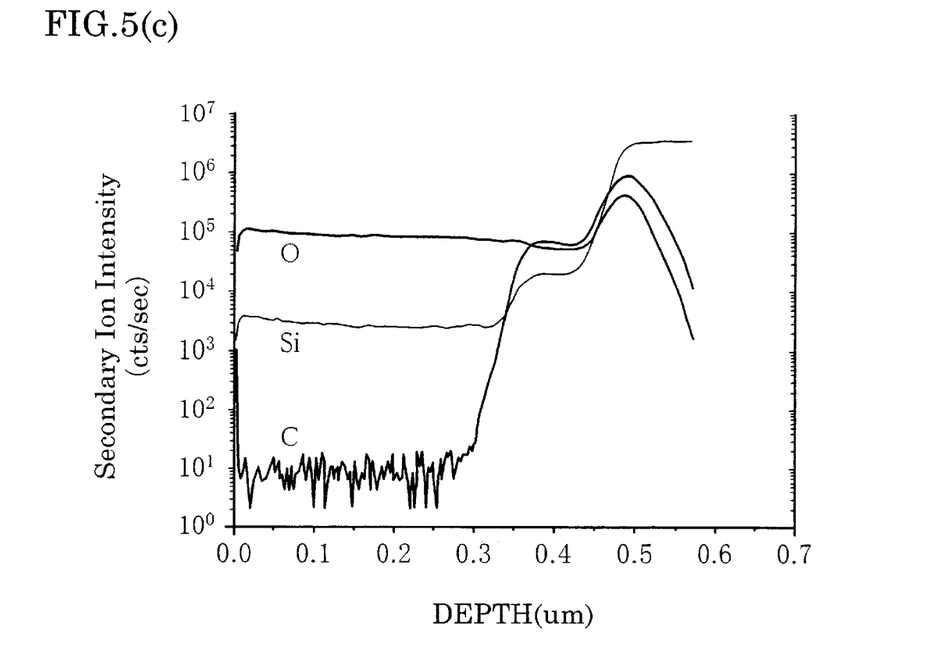

As shown in FIG. 5(c), when the organic polysiloxane film has undergone the ashing process in the prior art, separation of the Si and C atoms is observed within the range down to approximately 0.3 μm from the organic polysiloxane film surface. This indicates that the O radicals involved in ashing were diffused in the organic polysiloxane film and reacted with the C atoms causing the separation.

Figure 5D:
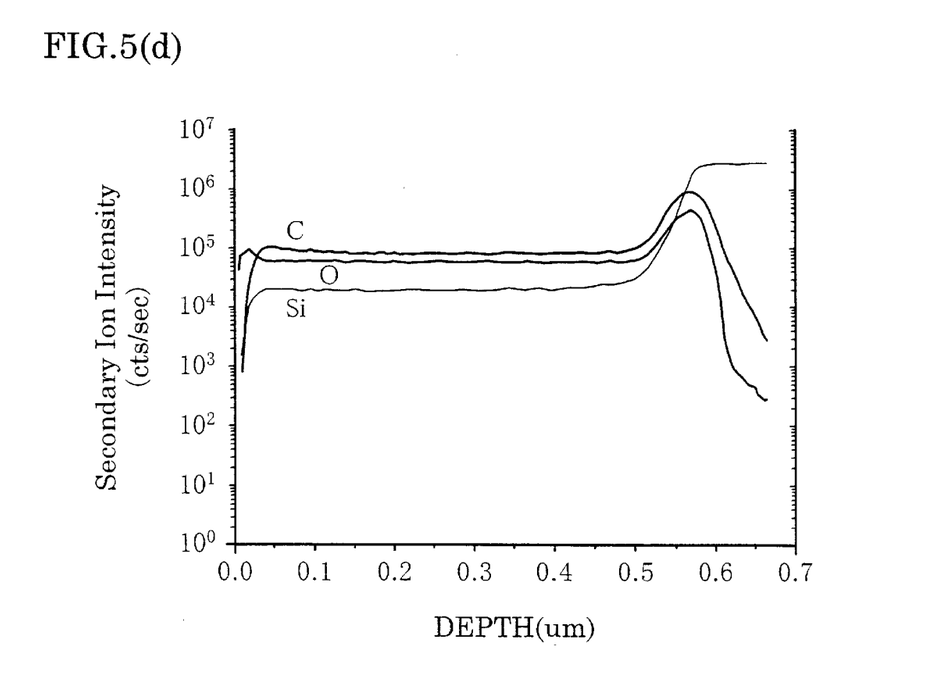

In addition, as shown in FIG. 5(d), an increase in O atoms is observed near the film surface in the organic polysiloxane film having undergone the $O_2$ ashing process according to the present invention. In conjunction with the results presented in FIG. 4, this is assumed to indicate that oxygen ions accelerated by the high voltage during the ashing process collided with the film and formed a protective film $SiO_2$. This phenomenon does not occur at a higher pressure as set in the prior art, at which the ions will collide with other particles and thus lose their energy. Since no major changes are observed in the various atoms except for in the vicinity of the film surface, it can be assumed that no moisture absorption that would lead to changes in the molecular structure and the dielectric constant occurred.

As described above, while a change in the molecular structure of the organic polysiloxane film occurs due to the diffusion of oxygen radicals in the film, which, in turn, changes the dielectric constant, in the ashing method in the prior art, the ashing process can be implemented without causing any change in the dielectric constant of the film by adopting the ashing method in the embodiment.

While the invention has been particularly shown and described with respect to a preferred embodiment thereof by referring to the attached drawings, the present invention is not limited to this example and it will be understood by those skilled in the art that various changes in form and detail may be made therein without departing from the spirit, scope and teaching of the invention.

For instance, while an explanation is given above in reference to the embodiment on an example in which the etching process and the ashing process are implemented inside a single processing chamber, the present invention is not limited by these particulars and it may be adopted in a plasma processing apparatus having separate processing chambers independent of each other, where the etching process and the ashing process are implemented separately.

In addition, while an explanation is given above in reference to the embodiment on an example in which the etching process and the ashing process are implemented at the same pressure, the present invention is not limited by these particulars and it may be implemented effectively as long as the pressure for at least the ashing process is set as described above.

Furthermore, while an explanation is given above in reference to the embodiment on an example in which the processes are implemented in a parallel-plane type plasma processing apparatus, the present invention is not limited by such structural details, and it may be adopted in an inductively coupled plasma processing apparatus or a microwave type plasma processing apparatus.

According to the present invention, the photoresist film on the organic polysiloxane film formed at the workpiece can be removed while minimizing the degree to which the film properties of the organic polysiloxane film change. As a result, the dielectric constant of the organic polysiloxane film is prevented from increasing as a result of the ashing process so as to take full advantage of the low dielectric constant characteristics of the film.

The entire disclosure of Japanese Patent Application No. 11-296693 filed on Oct. 19, 1999 including specification, claims, drawings and summary is incorporated herein by reference in its entirety.

What is claimed is:

1. A method of plasma ashing a resist film formed on or above a low dielectric constant organic film on a workpiece after etching the low dielectric constant organic film with an etching gas by using the resist film as a mask for an etching process in a processing chamber, the low dielectric constant organic film comprising atoms of Silicon, Oxygen, Carbon, and Hydrogen, the method comprising:

introducing an ashing into processing chamber;

setting the pressure in the processing chamber to a level ranging from about 30 mTorr to about 150 mTorr; and raising the ashing gas to plasma level, thereby substantially removing the resist film without substantially changing the dielectric constant of the low dielectric constant organic film, wherein the etching process and the plasma ashing are serially performed in the same processing chamber without retrieving the workpiece from the processing chamber, and wherein the ashing gas differs from the etching gas.

2. The method of claim 1, wherein the low dielectric constant organic film comprises an organic polysiloxane.

3. The method of claim 1, wherein the ashing gas comprises atoms of Oxygen.

* * * * *

UNITED STATES PATENT AND TRADEMARK OFFICE
CERTIFICATE OF CORRECTION

PATENT NO. : 6,670,276 B1 Page 1 of 1
DATED : December 30, 2003
INVENTOR(S) : Tomoki Suemasa et al.

It is certified that error appears in the above-identified patent and that said Letters Patent is hereby corrected as shown below:

<u>Title page,</u>
Item [57], ABSTRACT,
Line 15, delete the first occurrence of "the".

<u>Column 8,</u>
Line 46, "ashing into processing" should read -- ashing gas into the processing --.

Signed and Sealed this

Twenty-fourth Day of February, 2004

JON W. DUDAS
*Acting Director of the United States Patent and Trademark Office*